US 11,255,725 B2

(12) United States Patent
Ma

(10) Patent No.: US 11,255,725 B2
(45) Date of Patent: Feb. 22, 2022

(54) PHOTOSENSITIVE CIRCUIT, DRIVING METHOD THEREOF AND ELECTRONIC DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 490 days.

(21) Appl. No.: 16/098,302

(22) PCT Filed: Mar. 13, 2018

(86) PCT No.: PCT/CN2018/078839
§ 371 (c)(1),
(2) Date: Nov. 1, 2018

(87) PCT Pub. No.: WO2019/007100
PCT Pub. Date: Jan. 10, 2019

(65) Prior Publication Data
US 2020/0319023 A1  Oct. 8, 2020

(30) Foreign Application Priority Data
Jul. 3, 2017 (CN) .................. 201710531975.0

(51) Int. Cl.
*G01J 1/46* (2006.01)
*H01L 27/146* (2006.01)
(Continued)

(52) U.S. Cl.
CPC .......... *G01J 1/46* (2013.01); *H01L 27/14616* (2013.01); *G01J 2001/444* (2013.01);
(Continued)

(58) Field of Classification Search
CPC .. G01J 1/46; G01J 2001/444; G01J 2001/446; G01J 2001/448; G01J 1/44;
(Continued)

(56) References Cited

U.S. PATENT DOCUMENTS

2006/0256048 A1* 11/2006 Fish ................. G09G 3/3233
345/81
2011/0108704 A1* 5/2011 Kim ................. H04N 9/045
250/208.1
(Continued)

FOREIGN PATENT DOCUMENTS

CN        1987973 A    6/2007
CN      101532874 A    9/2009
(Continued)

OTHER PUBLICATIONS

International Search Report and Written Opinion dated May 30, 2018 from State Intellectual Property Office of the P.R. China.
(Continued)

*Primary Examiner* — Thanh Luu
*Assistant Examiner* — Monica T Taba
(74) *Attorney, Agent, or Firm* — Dilworth & Barrese, LLP.; Michael J. Musella, Esq.

(57) ABSTRACT

A photosensitive circuit, a driving method thereof and an electronic device are disclosed. The photosensitive circuit includes a photosensitive element and a signal acquisition circuit. The photosensitive element is configured to be able to generate a photosensitive voltage signal by changing threshold characteristic of the photosensitive element according to intensity of light incident into the photosensitive element; and the signal acquisition circuit configured to convert the photosensitive voltage signal into a photosensitive current signal.

18 Claims, 4 Drawing Sheets

(51) Int. Cl.
*G01J 1/44* (2006.01)
*H01L 29/786* (2006.01)

(52) U.S. Cl.
CPC ... *G01J 2001/446* (2013.01); *G01J 2001/448* (2013.01); *H01L 29/7869* (2013.01)

(58) Field of Classification Search
CPC .. H01L 27/14616; H01L 29/7869; G09G 5/10
See application file for complete search history.

(56) References Cited

U.S. PATENT DOCUMENTS

| | | | | |
|---|---|---|---|---|
| 2011/0141060 | A1* | 6/2011 | Kim | G06F 3/042 345/175 |
| 2012/0274608 | A1* | 11/2012 | Kim | H01L 27/14609 345/175 |
| 2014/0192035 | A1 | 7/2014 | Tai et al. | |
| 2015/0085202 | A1* | 3/2015 | Lien | G06F 3/0421 349/12 |
| 2016/0291743 | A1 | 10/2016 | Yang et al. | |
| 2017/0187972 | A1* | 6/2017 | Murao | H04N 5/37457 |
| 2018/0144678 | A1 | 5/2018 | Zhang et al. | |
| 2018/0249109 | A1* | 8/2018 | Yang | H04N 5/378 |

FOREIGN PATENT DOCUMENTS

| | | |
|---|---|---|
| CN | 103645821 A | 3/2014 |
| CN | 103984448 A | 8/2014 |
| CN | 104064140 A | 9/2014 |
| CN | 104867434 A | 8/2015 |
| CN | 105789202 A | 7/2016 |
| CN | 107093417 A | 8/2017 |
| WO | 2010150573 A1 | 12/2010 |

OTHER PUBLICATIONS

First Chinese Office Action dated Nov. 5, 2018.
Second Chinese Office Action dated Apr. 17, 2019.
Huang, Wenlong, "Organic Field-effect transistors and its photosensitivity based on PBDFTDTBT", Masters Thesis, May 2014, pp. 1-6.

* cited by examiner

PHOTOSENSITIVE CIRCUIT, DRIVING METHOD THEREOF AND ELECTRONIC DEVICE

The application claims priority to Chinese patent application No. 201710531975.0, filed on Jul. 3, 2017, the entire disclosure of which is incorporated herein by reference as part of the present application.

TECHNICAL FIELD

Embodiments of the present disclosure relate to a photosensitive circuit, a driving method thereof and an electronic device.

BACKGROUND

Photosensitive circuits can be widely applied in electronic devices such as imaging devices and touch control devices. The specific structure and performance of the photosensitive circuit directly affect the complexity and the performance of the electronic device such as the imaging device and the touch control device.

SUMMARY

At least one embodiment of the present disclosure provides a photosensitive circuit, and the photosensitive circuit comprises a photosensitive element and a signal acquisition circuit. The photosensitive element is configured to be able to generate a photosensitive voltage signal by changing threshold characteristic of the photosensitive element according to intensity of light incident into the photosensitive element; and the signal acquisition circuit configured to convert the photosensitive voltage signal into a photosensitive current signal.

For example, in the photosensitive circuit provided by at least one embodiment of the present disclosure, the photosensitive element comprises a first transistor; a first terminal of the first transistor is configured to receive a first supply voltage; and a second terminal of the first transistor is electrically connected with a control terminal of the first transistor and is configured to be an output terminal of the photosensitive element.

For example, in the photosensitive circuit provided by at least one embodiment of the present disclosure, the first transistor is an oxide semiconductor transistor.

For example, in the photosensitive circuit provided by at least one embodiment of the present disclosure, the signal acquisition circuit comprises a driving transistor; a control terminal of the driving transistor is configured to receive the photosensitive voltage signal of the photosensitive element; a first terminal of the driving transistor is configured to receive a second supply voltage; and a second terminal of the driving transistor is configured to output the photosensitive current signal.

For example, in the photosensitive circuit provided by at least one embodiment of the present disclosure, the signal acquisition circuit further comprises a compensating circuit; and the compensating circuit is configured to compensate the driving transistor, so that the signal acquisition circuit is able to output a photosensitive current signal corresponding to threshold voltage variation of the photosensitive element.

For example, in the photosensitive circuit provided by at least one embodiment of the present disclosure, the compensating circuit comprises a first capacitor, a second transistor, a first node and a second node; the output terminal of the photosensitive element is electrically connected to the first node; a first terminal of the first capacitor is electrically connected to the first node, and a second terminal of the first capacitor is electrically connected to the second node; and a first terminal of the second transistor is electrically connected to the second node, a second terminal of the second transistor is electrically connected to the second terminal of the driving transistor, and a control terminal of the second transistor is configured to receive a compensating control signal.

For example, the photosensitive circuit provided by at least one embodiment of the present disclosure further comprises a reset circuit, and the reset circuit is configured to reset the signal acquisition circuit and the photosensitive element.

For example, in the photosensitive circuit provided by at least one embodiment of the present disclosure, the reset circuit comprises a fourth transistor and a fifth transistor; a first terminal of the fourth transistor is configured to receive a third supply voltage, and a second terminal of the fourth transistor is electrically connected to the second node; and a first terminal of the fifth transistor is configured to receive a fourth supply voltage, and a second terminal of the fifth transistor is electrically connected to the first node.

For example, in the photosensitive circuit provided by at least one embodiment of the present disclosure, a control terminal of the fourth transistor and a control terminal of the fifth transistor are electrically connected to same one signal line.

For example, in the photosensitive circuit provided by at least one embodiment of the present disclosure, the second supply voltage and the fourth supply voltage are configured to be same one voltage electrical signal.

For example, the photosensitive circuit provided by at least one embodiment of the present disclosure further comprises a switching circuit, and the switching circuit is configured to control whether to output the photosensitive current signal outputted by the signal acquisition circuit.

For example, in the photosensitive circuit provided by at least one embodiment of the present disclosure, the switching circuit comprises a third transistor; a first terminal of the third transistor is electrically connected to the second terminal of the driving transistor; and a second terminal of the third transistor is configured to be an output terminal of the photosensitive circuit.

At least one embodiment of the present disclosure provides an electronic device, and the electronic device comprises the above-mentioned photosensitive circuit.

At least one embodiment of the present disclosure provides a driving method for a photosensitive circuit, and the driving method for the photosensitive circuit comprises: changing the threshold characteristic of the photosensitive element according to the intensity of light incident into the photosensitive element so as to produce the photosensitive voltage signal, and converting the photosensitive voltage signal into the photosensitive current signal, in a photosensitive stage.

For example, the driving method for the photosensitive circuit provided by at least one embodiment of the present disclosure further comprises: resetting the signal acquisition circuit and the photosensitive circuit before the photosensitive stage.

For example, the driving method for the photosensitive circuit provided by at least one embodiment of the present disclosure further comprises: compensating the signal acquisition circuit before the photosensitive stage and after resetting is performed.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 6:
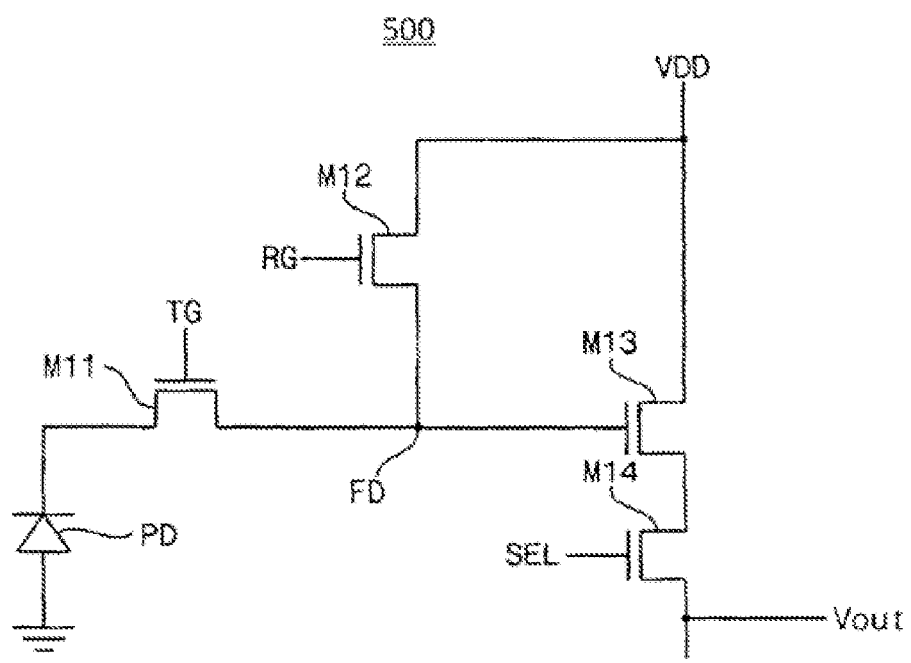
FIG. 6 is a circuit diagram of a photosensitive circuit.

For example, FIG. 6 is a circuit diagram of a photosensitive circuit. As illustrated in FIG. 6, the photosensitive circuit 500 comprises a photodiode PD, a transmission transistor M11, a reset transistor M12, a source follower transistor M13 and a select transistor M14. When an on voltage is applied to a gate electrode RG of the reset transistor M12, the reset transistor M12 is switched on, and the electrical potential of a sensing node (namely a floating diffusion node FD) is increased until the electrical potential is equal to the electrical level of supply voltage VDD. The source follower transistor M13 and the select transistor M14 sample the electrical potential of the floating diffusion node FD, and the sampled potential may be taken as the reference potential.

In a photosensitive accumulation stage, when light is incident into the photodiode PD, in response to the incident light, the photodiode PD produces electron-hole pairs (EHPs). After the photosensitive accumulation stage, when an on voltage is applied to the gate electrode TG of the transmission transistor M11, charges accumulated (or stored) in the photodiode PD are transmitted to the floating diffusion node FD. The source electrical potential of the source follower transistor M13 changes when the electrical potential of the floating diffusion node FD, which is basically directly proportional to the quantity of transmitted charges, is obviously reduced. When an on voltage is applied to the gate electrode SEL of the select transistor M14, the selection transistor M14 is switched on, and the source voltage of the source follower transistor M13 is outputted as an output voltage Vout. Optical sensing is realized by measuring the difference between the reference potential and the output voltage Vout.

The inventor has noted that: for example, the photosensitive circuit as illustrated in FIG. 6 acquires a photosensitive signal based on the current outputted by the photodiode PD, and the intensity of the photosensitive signal outputted by the photosensitive circuit can also be affected by the characteristics (e.g., the threshold characteristic) of the photodiode PD and the source follower transistor, thereby reducing the uniformity of the photosensitive electrical signal outputted by the photosensitive circuit array.

For example, the transistors may be divided into N type and P type transistors according to the characteristics of the transistors. For clarity, detailed description will be given below to the technical proposals of the present disclosure by taking the case that the transistors in the embodiments of the present disclosure are P type transistors as an example. However, the transistors in the embodiments of the present disclosure are not limited to the P type transistors. One or more transistors in the embodiment of the present disclosure may also be realized by those skilled in the art by utilization of N type transistors according to actual demands, and control signals required to be applied are correspondingly changed. These transistors, for example, are thin-film transistors (TFTs).

Embodiments of the present disclosure provide a photosensitive circuit, a driving method thereof and an electronic device, which acquire a photosensitive electrical signal by changing the threshold characteristic of a photosensitive element.

At least one embodiment of the present disclosure provides a photosensitive circuit, and the photosensitive circuit comprises a photosensitive element and a signal acquisition circuit. The photosensitive element is configured to be able to generate a photosensitive voltage signal by changing threshold characteristic of the photosensitive element according to intensity of light incident into the photosensitive element; and the signal acquisition circuit configured to convert the photosensitive voltage signal into a photosensitive current signal.

At least one embodiment of the present disclosure further provides an electronic device, and the electronic device comprises the above-mentioned photosensitive circuit.

At least one embodiment of the present disclosure further provides a driving method for a photosensitive circuit, and the driving method for the photosensitive circuit comprises: changing the threshold characteristic of the photosensitive element according to the intensity of light incident into the photosensitive element so as to produce the photosensitive voltage signal, and converting the photosensitive voltage signal into the photosensitive current signal, in a photosensitive stage.

Non-limitive descriptions are given to the photosensitive circuit, the driving method thereof and the electronic device provided by the embodiments of the present disclosure in the following with reference to a plurality of embodiments. As described in the following, in case of no conflict, different features in these specific embodiments may be combined so as to obtain new embodiments, and the new embodiments are also fall within the scope of present disclosure.

First Embodiment

Figure 1:
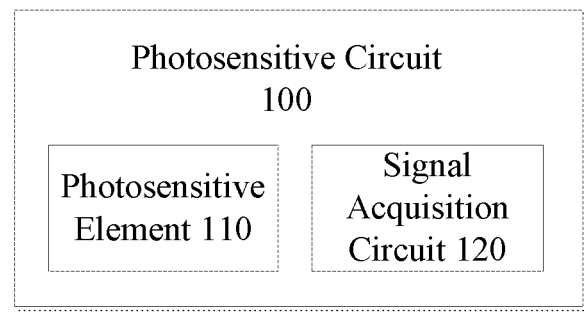
FIG. 1 is an illustrative block diagram of a photosensitive circuit provided by a first embodiment.

The present embodiment provides a photosensitive circuit 100. The photosensitive circuit 100 can acquire a photosensitive electrical signal by changing the threshold characteristic of a photosensitive element 110. For example, FIG. 1 is an illustrative block diagram of the photosensitive circuit 100 provided by the first embodiment. For example, as illustrated in FIG. 1, the photosensitive circuit 100 may comprise the photosensitive element 110 and a signal acquisition circuit 120. For example, the specific implementation of the photosensitive element 110 and the signal acquisition circuit 120 may be set according to actual application demands No specific limitation will be given here in the embodiment of the present disclosure. For example, the photosensitive circuit 100 provided by the first embodiment of the present disclosure may be implemented as the circuit as illustrated in FIG. 2.

Figure 2:
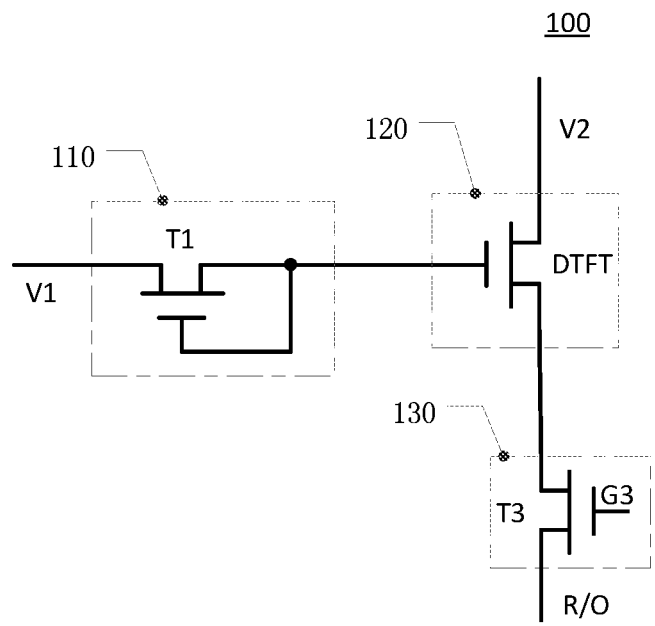
FIG. 2 is an illustrative structural view of the photosensitive circuit as illustrated in FIG. 1.

For example, as illustrated in FIGS. 1 and 2, the photosensitive element 110 may be configured to be able to generate a photosensitive voltage signal by changing the threshold characteristic (e.g., threshold voltage characteristic) of the photosensitive element according to the intensity of light incident into the photosensitive element. For example, as illustrated in FIG. 2, the photosensitive element 110 may include a first transistor T1. For example, the first terminal of the first transistor T1 may be configured to receive a first supply voltage V1. The first supply voltage V1, for example, may be a constant positive voltage, and the specific value of the first supply voltage V1, for example, may be set according to actual application demands. No specific limitation will be given here in the embodiment of the present disclosure. For example, the second terminal of the first transistor T1 may be electrically connected with the control terminal of the first transistor T1 and is configured to be the output terminal of the photosensitive element 110.

For example, the threshold characteristic (e.g., threshold voltage characteristic) of the first transistor can be changed when the first transistor T1 is irradiated by light (e.g., infrared light or visible light). For example, the specific type of the first transistor T1 may be selected according to actual application demands (for example, the waveband of light to be sensed). The first transistor T1, for example, may be an oxide semiconductor transistor, namely adopting oxide semiconductor materials as the active layer of the transistor. The oxide semiconductor material, for example, may include ZnO, MgZnO, Zn—Sn—O (ZTO), In—Zn—O (IZO), SnO2, Ga2O3, In—Ga—O (IGO), In2O3, In—Sn—O (ITO), In—Ga—Zn—O (IGZO), InAlZnO (IAZO), etc. But the embodiment of the present disclosure is not limited to the above specific oxide semiconductor materials.

For example, under the condition of no light irradiation, the threshold voltage of the first transistor T1 is Vth1 (namely the initial threshold voltage of the first transistor T1); and under the condition of light irradiation, the threshold voltage of the first transistor T1 is changed into Vth2, and Vth1 is not equal to Vth2. For example, as for a P type (e.g., positive-channel metal oxide semiconductor (PMOS) structure) transistor, the threshold voltage of the first transistor T1 is a negative value; and as for an N type (e.g., negative-channel metal oxide semiconductor (NMOS) structure) transistor, the threshold voltage of the first transistor T1 is a positive value. For example, as for a P type transistor, when the absolute value of the threshold voltage of the first transistor T1 is greater, it indicates that the intensity of light incident into the first transistor T1 is higher, and correspondingly, the difference between the electrical potential of the second terminal and the electrical potential of the first terminal of the first transistor T1 can be greater, but the embodiment of the present disclosure is not limited thereto.

For example, as illustrated in FIGS. 1 and 2, the signal acquisition circuit 120 can be configured to convert the photosensitive voltage signal into a photosensitive current signal. For example, as illustrated in FIG. 2, the signal acquisition circuit 120 may include a driving transistor DTFT. The control terminal of the driving transistor DTFT may be configured to receive the photosensitive voltage signal of the photosensitive element 110; the first terminal of the driving transistor DTFT may be configured to receive a second supply voltage V2, and the second supply voltage V2, for example, may be a constant positive voltage; and the second terminal of the driving transistor DTFT may be configured to output the photosensitive current signal. For example, when the intensity of the light incident into the photosensitive element 110 is changed, the photosensitive voltage signal of the photosensitive element 110 received by the control terminal of the driving transistor DTFT can also be changed along with it, so as to change the conduction degree of the driving transistor DTFT and the intensity of the photosensitive current signal outputted by the second terminal of the driving transistor DTFT. Therefore, the photosensitive circuit 100 provided by the first embodiment acquires the photosensitive signal by changing the threshold characteristic of the photosensitive element 110.

For example, as illustrated in FIG. 2, the photosensitive circuit 100 may further comprise a switching circuit 130. The switching circuit 130 may be configured to control whether to output the photosensitive current signal outputted by the signal acquisition circuit 120. For example, the specific implementation of the switching circuit 130 may be set according to actual application demands. No specific limitation will be given here in the embodiment of the present disclosure. For example, as illustrated in FIG. 2, the switching circuit 130 may include a third transistor T3. The first terminal of the third transistor T3 may be electrically connected to the second terminal of the driving transistor DTFT, and the second terminal of the third transistor T3 may be configured to be the output terminal of the photosensitive circuit 100.

For example, when the third transistor T3 is a P type transistor, if a signal with high electrical level is applied to the control terminal G3 of the third transistor T3, the third transistor T3 is in the off-state, so the output end R/O (namely the output terminal of the photosensitive circuit 100) of the switching circuit 130 does not output the photosensitive current signal outputted by the signal acquisition circuit 120; and if a signal with low electrical level is applied to the control terminal G3 of the third transistor T3, the third transistor T3 is in the on-state, so the output end R/O (namely the output terminal of the photosensitive circuit 100) of the switching circuit 130 outputs the photosensitive current signal outputted by the signal acquisition circuit 120.

For example, in the first embodiment and other embodiments of the present disclosure, only the first transistor T1 is a photosensitive transistor and the remaining transistors are all non-photosensitive transistors. It should be noted that the transistors adopted in the first embodiment and other embodiments of the present disclosure may be TFTs or other switching elements with same characteristics. For example, in the manufacturing process, these transistors can be manufactured in light-shielding areas, so as to avoid the adverse effects of illumination on the characteristics of these transistors. The source electrode and the drain electrode of the transistor adopted here may be symmetrical in structure, so the source electrode and the drain electrode of the transistor may be same in physical structure. In the embodiments of the present disclosure, in order to distinguish the other two poles of the transistor, except for the gate electrode served as a control terminal, one pole is directly described as a first terminal and the other pole is a second terminal, so the first terminals and the second terminals of all or partial transistors in the embodiment of the present disclosure may be exchanged as required. For example, the first terminal of the transistor in the embodiment of the present disclosure may be a source electrode and the second terminal may be a drain electrode; or the first terminal of the transistor is a drain electrode and the second terminal is a source electrode.

The photosensitive circuit provided by the present embodiment can acquire the photosensitive electrical signal by changing the threshold characteristic of the photosensitive element, and does not acquire the photosensitive electrical signal based on the current signal produced by the photosensitive element.

Second Embodiment

The present embodiment provides a photosensitive circuit 100. The photosensitive circuit 100 can acquire a photosensitive current signal corresponding to the threshold voltage variation of a photosensitive element 110, that is, the photosensitive current signal acquired by the photosensitive circuit 100 provided by the present embodiment is only relevant to the intensity of light incident into the photosensitive element 110, so as to avoid the change of the photosensitive current signal due to the change of the threshold characteristic of the transistor caused by, for example, the manufacturing process.

Figure 3A:
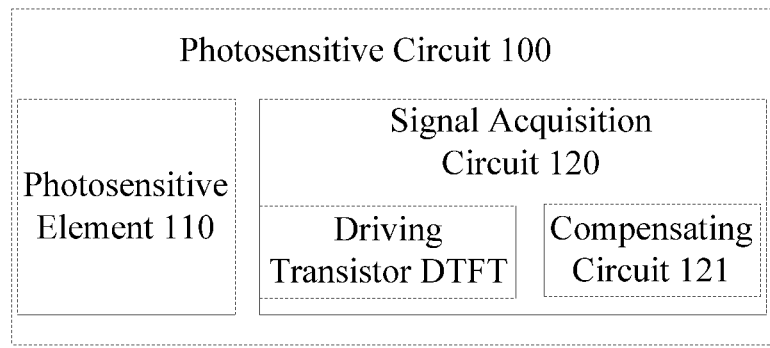
FIG. 3A is an illustrative block diagram of a photosensitive circuit provided by a second embodiment.
Figure 3B:
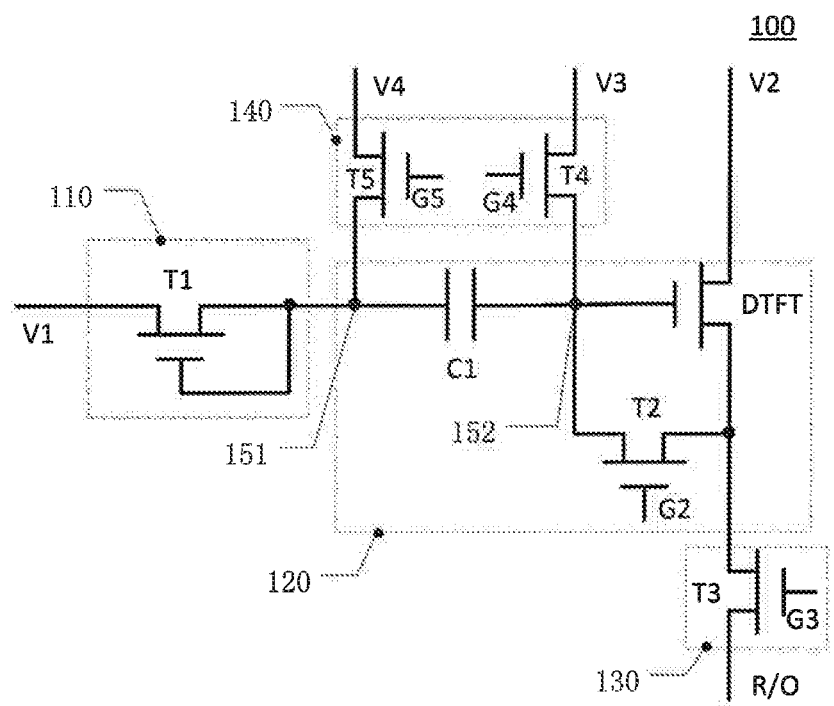
FIG. 3B is an illustrative structural view of the photosensitive circuit as illustrated in FIG. 3A.

For example, FIG. 3A is an illustrative block diagram of the photosensitive circuit 100 provided by the second embodiment. For example, as illustrated in FIG. 3A, the photosensitive circuit 100 may comprise the photosensitive element 110 and a signal acquisition circuit 120. The signal acquisition circuit 120, for example, may include a driving transistor DTFT and a compensating circuit 121. For example, as illustrated in FIG. 3B, the photosensitive circuit 100 may further comprise a switching circuit 130 according to actual application demands. For example, the specific content of the photosensitive element 110, the driving transistor DTFT and the switching circuit 130 may refer to the first embodiment. No further description will be given here.

For example, the compensating circuit 121 of the signal acquisition circuit 120 may be configured to compensate the driving transistor DTFT, so that the signal acquisition circuit 120 can output the photosensitive current signal corresponding to the threshold voltage variation of the photosensitive element 110. For example, the specific implementation of the compensating circuit 121 may be set according to actual application demands No specific limitation will be given here in the embodiment of the present disclosure. For example, the compensating circuit 121 in the second embodiment of the present disclosure may be implemented as the circuit as illustrated in FIG. 3B.

For example, as illustrated in FIG. 3B, the compensating circuit 121 may include a first capacitor C1, a second transistor T2, a first node 151 and a second node 152. For example, the output terminal of the photosensitive element 110 is connected to the first node 151; the first terminal of the first capacitor C1 is electrically connected to the first node 151, and the second terminal of the first capacitor C1 is electrically connected to the second node 152; the first terminal of the second transistor T2 is electrically connected to the second node T2; the second terminal of the second transistor T2 is electrically connected to the second terminal of the driving transistor DTFT; and the control terminal G2 of the second transistor T2 is configured to receive a compensating control signal.

For example, detailed description will be given below to the compensating function of the compensating circuit 121 by taking the case that the second transistor T2 is a P type transistor as an example. For example, when the compensating control signal received by the control terminal G2 of the second transistor T2 is a signal with low electrical level, the second transistor T2 is in the on-state, and the second transistor T2 in the on-state shorts the control terminal and the second terminal of the driving transistor DTFT; and subsequently, the first capacitor C1 is charged through the driving transistor DTFT, and after charging is over, the final voltage of the control terminal (namely the second node 152) of the driving transistor DTFT is equal to the electrical potential V2+Vth_D of the second terminal and is stored in the first capacitor C1. Vth_D here refers to the threshold voltage of the driving transistor DTFT.

For example, the photosensitive circuit 100 provided by the embodiment may further comprise a reset circuit 140. The reset circuit 140 can be configured to reset the signal acquisition circuit 120 and the photosensitive element 110. For example, the specific implementation of the reset circuit 140 may be set according to actual application demands No specific limitation will be given here in the embodiment of the present disclosure. For example, the reset circuit 140 in the second embodiment of the present disclosure may be implemented as the circuit as illustrated in FIG. 3B.

For example, as illustrated in FIG. 3B, the reset circuit 140 may include a fourth transistor T4 and a fifth transistor T5. For example, the first terminal of the fourth transistor T4 is configured to receive a third supply voltage V3, and the second terminal of the fourth transistor T4 is electrically connected to the second node 152. For example, the first terminal of the fifth transistor is configured to receive a fourth supply voltage V4, and the second terminal of the fifth transistor T5 is electrically connected to the first node 151.

For example, detailed description will be given below to the reset function of the reset circuit 140 by taking the case that both the fourth transistor T4 and the fifth transistor T5 are P type transistor as an example. For example, when both the control terminal G4 of the fourth transistor T4 and the control terminal G5 of the fifth transistor T5 receive a signal with low electrical level, both the fourth transistor T4 and the fifth transistor T5 are in the on-state, and in this case, the electrical potential stored at two terminals of the first capacitor C1 may be set to be V4 and V3 through the fourth transistor T4 and the fifth transistor T5 in the on-state. Thus, the reset circuit 140 can allow the signal acquisition circuit 120 and the photosensitive element 110 to be back to the initial state, so as to avoid the charges stored at two terminals of the first capacitor C1 in the last sensing cycle from affecting the current sensing cycle. For example, the third supply voltage V3, for example, can allow the driving transistor DTFT to be in the on-state after a reset stage.

For example, according to actual application demands, the control terminal G4 of the fourth transistor T4 and the control terminal G5 of the fifth transistor T5 may be electrically connected to the same signal line, so as to simplify the structure of the photosensitive circuit 100 provided by the second embodiment of the present disclosure. For example, according to actual application demands, the second supply voltage V2 and the fourth supply voltage V4 may be configured to be same voltage electrical signal, namely the second supply voltage V2 is equal to the fourth supply voltage V4, or the second supply voltage V2 and the fourth supply voltage V4 can be electrically connected with each other, so as to solve the IR drop problem (voltage drop) of the driving transistor DTFT, and details are given in the following.

Figure 3C:
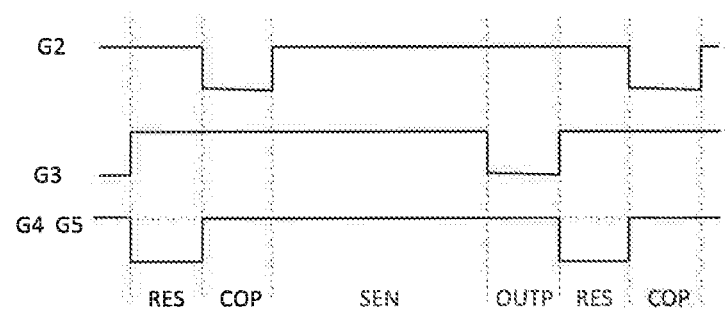
FIG. 3C is an illustrative drive timing diagram of the photosensitive circuit as illustrated in FIG. 3B.

For example, detailed description will be given below to the illustrative working mode of the photosensitive circuit 100 provided by the second embodiment of the present disclosure by taking the photosensitive circuit 100 as illustrated in FIG. 3B as an example. For example, FIG. 3C is an illustrative drive timing diagram of the photosensitive circuit as illustrated in FIG. 3B. For example, the photosensitive circuit 100 as illustrated in FIG. 3B can acquire the photosensitive electrical signal (e.g., a current signal) by the following steps.

S110: resetting the signal acquisition circuit and the photosensitive circuit in the reset stage.

S120: compensating the signal acquisition circuit in a compensation stage.

S130: changing the threshold characteristic of the photosensitive element according to the intensity of light incident into the photosensitive element, so as to generate the photosensitive voltage signal, and converting the photosensitive voltage signal into a photosensitive current signal, in a photosensitive stage.

S140: outputting the photosensitive current signal outputted by the signal acquisition circuit in a signal output stage.

For example, as illustrated in FIGS. 3B and 3C, in the step S110, namely in the reset stage RES, an on signal (e.g., a signal with low electrical level) may be applied to the control terminal G4 of the fourth transistor T4 and the control terminal G5 of the fifth transistor T5, and an off signal (e.g., a signal with high electrical level) may be applied to the control terminal G2 of the second transistor T2 and the control terminal G3 of the third transistor T3, so that the fourth transistor T4 and the fifth transistor T5 can be in the on-state, and the second transistor T2 and the third transistor T3 can be in the off-state. In this case, the electrical potential stored at two terminals of the first capacitor C1 may be set to be the voltage V4 and the voltage V3 through the fourth transistor T4 and the fifth transistor T5 in the on-state, so as to avoid the charges stored at two terminals of the first capacitor C1 in the last sensing cycle from affecting the current sensing cycle.

For example, as illustrated in FIGS. 3B and 3C, in the step S120, namely in the compensation phase COP, an on signal (e.g., a signal with low electrical level) may be applied to the control terminal G2 of the second transistor T2, and an off signal (e.g., a signal with high electrical level) may be applied to the control terminal G3 of the third transistor T3, the control terminal G4 of the fourth transistor T4 and the control terminal G5 of the fifth transistor T5, so that the second transistor T2 can be in the on-state, and the third transistor T3, the fourth transistor T4 and the fifth transistor T5 can be in the off-state. In this case, the electrical potential of the first node 151, namely the electrical potential of one terminal of the first capacitor C1, is equal to the electrical potential $V1+Vth\_1$ of the output terminal of the photosensitive element 110, and the electrical potential of the second node 152, namely the electrical potential of the other terminal of the first capacitor C1, is equal to the electrical potential $V2+Vth\_D$ of the control terminal of the driving transistor DTFT. Thus, the voltage difference between two terminals of the first capacitor C1 is $V2+Vth\_D-V1-Vth\_1$. Moreover, in this case, the third transistor T3 is in the off-state, so the driving transistor DTFT does not output the photosensitive current signal except a charging circuit for charging the first capacitor C1.

For example, as illustrated in FIGS. 3B and 3C, in the step S130, namely in the photosensitive stage SEN, an off signal (e.g., a signal with high electrical level) may be applied to the control terminals G2-G5 of the second, third, fourth and fifth transistors T2-T5, so that the second, third, fourth and fifth transistors can be in the off-state, and in this case, the second node 152 is in the suspended state. Meanwhile, the photosensitive element 110 is illuminated, namely light is incident into the photosensitive element 110, so the threshold of the photosensitive element 110 is changed from $Vth\_1$ into $Vth\_2$, and correspondingly, the electrical potential of the first node 151 is changed from $V1+Vth\_1$ into $V1+Vth\_2$. Because the second node 152 is in the floating state in this case, the quantity of charges stored in the first capacitor C1 cannot change, namely the quantity of charges stored in the first capacitor C1 is kept unchanged. Correspondingly, according to the law of conservation of charge, the voltage difference between the two terminals of the first capacitor C1 is also kept unchanged. Thus, the electrical potential of the second node 152, namely the electrical potential of the control terminal of the driving transistor DTFT, is changed into $Vth\_2-Vth\_1+V2+Vth\_D$ from $V2+Vth\_D$.

For example, as illustrated in FIGS. 3B and 3C, in the step S140, namely in the signal output phase OUTP, an on signal (e.g., a signal with low electrical level) may be applied to the control terminal G3 of the third transistor T3, and an off signal (e.g., a signal with high electrical level) may be applied to the control terminal G2 of the second transistor T2, the control terminal G4 of the fourth transistor T4 and the control terminal G5 of the fifth transistor T5, so that the third transistor T3 can be in the on-state, and the second transistor T2, the fourth transistor T4 and the fifth transistor T5 can be in the off-state. In this case, the photosensitive current signal outputted by the signal acquisition circuit 120 may be outputted from the output terminal of the photosensitive circuit 100 through the driving transistor DTFT and the third transistor T3 in the on-state. The magnitude of the photosensitive current signal is controlled by the driving transistor DTFT.

In this case, the driving transistor DTFT is in the saturated state; the electrical potential of the control terminal (namely a gate electrode) of the driving transistor is $Vth\_2-Vth\_1+$ V2+Vth_D; and the electrical potential of the first terminal (namely a source electrode) is V2. Therefore, the current Ids (namely the photosensitive current signal) outputted when the driving transistor DTFT is in the saturated state may be obtained by the following computing formula:

$$Ids = 1/2 \times K(Vgs - \text{Vth\_D})^2$$
$$= 1/2 \times K \times (\text{Vth\_2} - \text{Vth\_1} + V2 + \text{Vth\_D} - V2 - \text{Vth\_D})^2$$
$$= 1/2 \times K \times (\text{Vth\_2} - \text{Vth\_1})^2,$$

where K=W/L×C×u; W/L refers to the width to length ratio of a channel of the driving transistor DTFT; u refers to the electron mobility; and C refers to the capacitance per unit area.

Therefore, the photosensitive current signal outputted by the driving transistor DTFT is only relevant to the threshold voltage variation of the photosensitive element 110 and is irrelevant to the threshold of the driving transistor DTFT and the initial threshold of the photosensitive element 110, namely the photosensitive current signal acquired by the photosensitive circuit 100 is only relevant to the intensity of light incident into the photosensitive element 110, so as to avoid the threshold of the driving transistor DTFT and the initial threshold of the photosensitive element 110 from affecting the photosensitive current signal outputted by the signal acquisition circuit 120, thereby avoiding the change of the photosensitive current signal due to the change of the threshold of the driving transistor DTFT and the initial threshold of the photosensitive element 110, which are caused by, for example, the manufacturing process. Moreover, the obtained photosensitive current signal is also irrelevant to the supply voltage V2, so as to avoid the change of the supply voltage V2 applied to the photosensitive circuit due to the change of the length of a power line (IR drop can be then caused), thereby overcoming the non-uniformity defect (for example, under same illumination intensity, the photosensitive circuit disposed at different positions outputs photosensitive signals with different intensities) caused by the IR drop (voltage drop) of the driving transistor DTFT of each pixel unit in the pixel array.

Third Embodiment

Figure 4A:
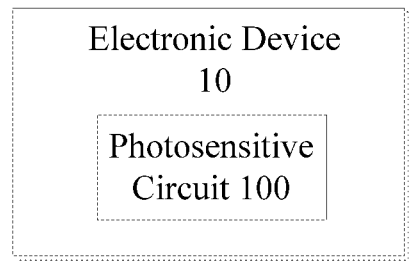
FIG. 4A is an illustrative block diagram of an electronic device provided by a third embodiment.

The present embodiment provides an electronic device 10. The electronic device, for example, may be implemented as an imaging device, a touch device or other devices requiring the photosensitive circuit. No specific limitation will be given here in the embodiment of the present disclosure. For example, FIG. 4A is an illustrative block diagram of the electronic device provided by the third embodiment. For example, the electronic device may comprise the photosensitive circuit 100 provided by any embodiment of the present disclosure. It should be noted that other necessary components of the electronic device may adopt applicable conventional components, which shall be understood by those skilled in the art, will not be further described here, and shall not be construed as a limitation on the embodiment of the present disclosure.

Figure 4B:
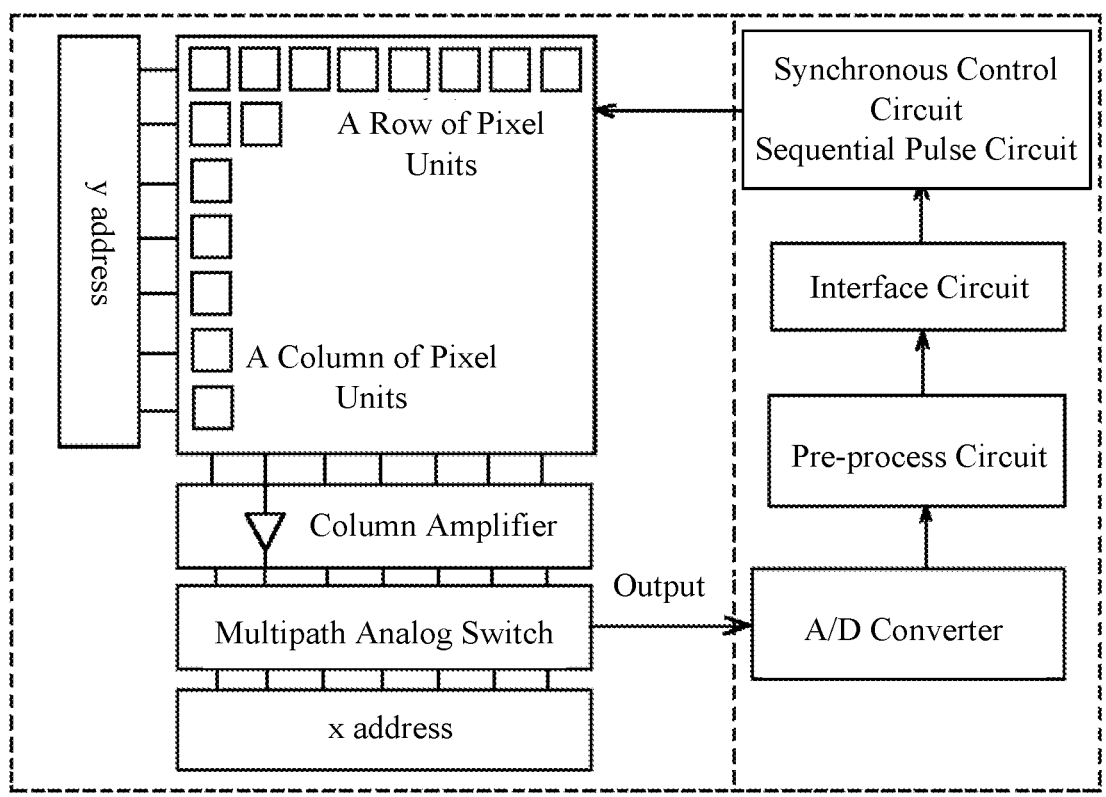
FIG. 4B is an illustrative block diagram of an imaging device.

For example, FIG. 4B is an illustrative block diagram of an imaging device. For example, detailed description will be given below to the electronic device 10 provided by the third embodiment of the present disclosure by taking the imaging device as illustrated in FIG. 4B as an example. For example, as illustrated in FIG. 4B, the imaging device may comprise a pixel unit array and a peripheral circuit. For example, the pixel unit array may include pixel units arranged in an array, and each pixel unit, for example, may include the photosensitive circuit provided by any embodiment of the present disclosure. For example, as illustrated in FIG. 4B, the pixel unit array is arranged into a square matrix along X and Y directions, and each pixel unit in the square matrix has addresses in the X and Y directions (for example, the row direction and the column direction), and the addresses may be respectively selected through address decoders of corresponding row line and corresponding column line in the two directions; and the output current/voltage signal is amplified and then sent to an A/D converter for analog-to-digital conversion and converted into a digital signal for output. As for the embodiment as illustrated in FIG. 3B, for example, an R/O line is connected with the column line and the gate electrode G3 of the third transistor T3 is connected with the row line, so the progressive read-out of the photosensitive signal of the pixel unit array can be realized by control of a scanning signal on the row line.

For example, because the photosensitive circuit provided by the present embodiment can acquire the photosensitive electrical signal by changing the threshold characteristic of the photosensitive element, and does not acquire the photosensitive electrical signal based on the current signal produced by the photosensitive element, so the imaging device provided by the embodiment can realize the imaging function based on the threshold characteristic of the photosensitive element in the pixel unit.

For example, in the manufacturing process of the pixel unit array of the imaging device, the thresholds of the transistors in the pixel unit array may be different due to, for example, the non-uniform property of raw materials and process conditions. For example, the initial threshold voltage of the first transistors of different pixel units may be different. For another example, the threshold voltage of the driving transistors of different pixel units may be different. When the photosensitive electrical signal outputted by the photosensitive circuit of the pixel unit is only relevant to the threshold voltage variation of the photosensitive element, the photosensitive current signal acquired by the photosensitive circuit is only relevant to the intensity of light incident into the photosensitive element, so as to avoid the threshold of the driving transistor and the initial threshold of the photosensitive element from affecting the photosensitive current signal outputted by the signal acquisition circuit, thereby avoiding the change of the photosensitive current signal due to the change of the threshold of the driving transistor and the initial threshold of the photosensitive element, which are caused by, for example, the manufacturing process. Therefore, the imaging uniformity of the imaging device can be improved, and the demand for subsequent image processing (for example, removing background current caused by the photosensitive circuit in each pixel unit) of an image acquired by the imaging device can be avoided.

Fourth Embodiment

Figure 5:
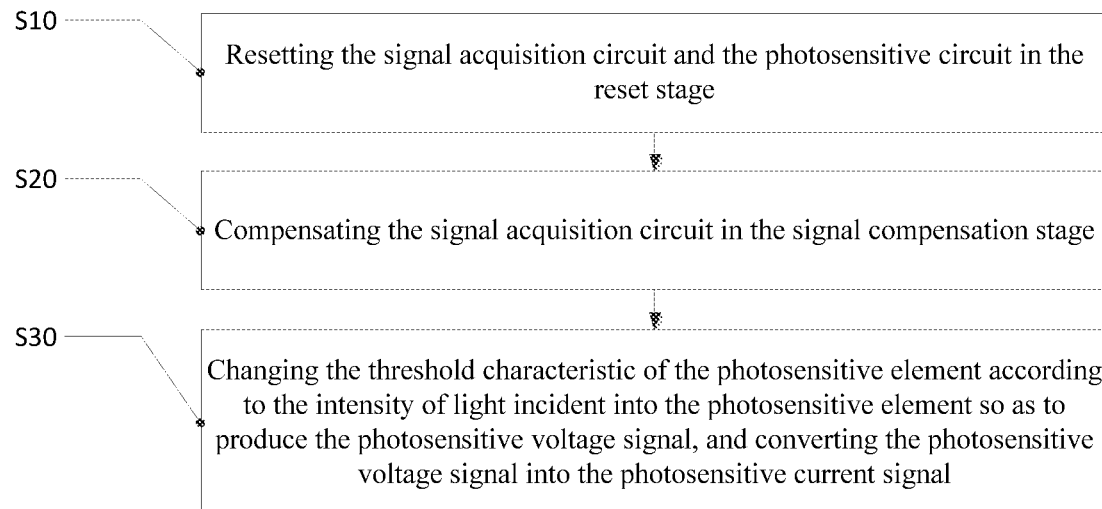
FIG. 5 is an illustrative flowchart of a driving method for a photosensitive circuit.

The present embodiment provides a driving method for a photosensitive circuit. The driving method for the photosensitive circuit can drive the photosensitive circuit provided by any embodiment of the present disclosure. For example, FIG. 5 is an illustrative flowchart of the driving method for the photosensitive circuit. For example, illustrative description is given in FIG. 5 to the driving method for the photosensitive circuit provided by the fourth embodiment by taking the embodiment as illustrated in FIG. 3B as an example. But the embodiment of the present disclosure is not limited thereto. For example, as illustrated in FIG. 5, the driving method for the photosensitive circuit may comprise the following steps.

S10: resetting the signal acquisition circuit and the photosensitive circuit in the reset stage.

S20: compensating the signal acquisition circuit in the signal compensation stage.

S30: changing the threshold characteristic of the photosensitive element according to the intensity of light incident into the photosensitive element so as to produce a photosensitive voltage signal, and converting the photosensitive voltage signal into the photosensitive current signal, in the photosensitive stage.

For example, according to actual application demand, the driving method for the photosensitive circuit may further comprise the following step S40.

S40: outputting the photosensitive current signal outputted by the signal acquisition circuit in the signal output stage.

For example, the specific implementation of the steps S10, S20, S30 and S40 may respectively refer to the steps S110, S120, S130 and S140 in the second embodiment of the present disclosure. No further description will be given here.

It is apparent that the presented disclosure may be changed and modified by those skilled in the art without departure from the spirit and scope of the disclosure, if the above-mentioned changes and modifications of the presented disclosure belong to the scope of the claims of the presented disclosure and its equivalent technologies, the presented disclosure is intended to include the above changes and modifications.

Embodiments of the present disclosure provide a photosensitive circuit, a driving method thereof and an electronic device, which acquire a photosensitive electrical signal by changing the threshold characteristic of a photosensitive element.

What are described above is related to the illustrative embodiments of the disclosure only and not limitative to the scope of the disclosure; the scopes of the disclosure are defined by the accompanying claims.

What is claimed is:

1. A photosensitive circuit, comprising:
a photosensitive element configured to be able to generate a photosensitive voltage signal by changing threshold characteristic of the photosensitive element according to intensity of light incident into the photosensitive element; and
a signal acquisition circuit configured to convert the photosensitive voltage signal into a photosensitive current signal;
wherein the photosensitive current signal Ids may be obtained by the following computing formula:

$$Ids = \frac{1}{2} \times K \times (Vth\_2 - Vth\_1)^2,$$

where $K = W/L \times C \times u$; W/L refers to the width to length ratio of a channel of the driving transistor DTFT; u refers to the electron mobility; C refers to the capacitance per unit area; and Vth_1 and Vth_2 are threshold voltages before and after the light is incident into the photosensitive element;
the signal acquisition circuit comprises a driving transistor;
a control terminal of the driving transistor is configured to receive the photosensitive voltage signal of the photosensitive element;
a first terminal of the driving transistor is configured to receive a second supply voltage; and
a second terminal of the driving transistor is configured to output the photosensitive current signal;
the signal acquisition circuit further comprises a compensating circuit; and
the compensating circuit is configured to compensate the driving transistor, so that the signal acquisition circuit is able to output a photosensitive current signal corresponding to threshold voltage variation of the photosensitive element;
the compensating circuit comprises a first capacitor, and the output terminal of the photosensitive element is electrically connected to a first terminal of the first capacitor.

2. The photosensitive circuit according to claim 1, wherein the photosensitive element comprises a first transistor;
a first terminal of the first transistor is configured to receive a first supply voltage; and
a second terminal of the first transistor is electrically connected with a control terminal of the first transistor and is configured to be an output terminal of the photosensitive element.

3. The photosensitive circuit according to claim 2, wherein the first transistor is an oxide semiconductor transistor.

4. The photosensitive circuit according to claim 1, wherein the compensating circuit further comprises a second transistor;
the first terminal of the first capacitor is electrically connected to a first node, and a second terminal of the first capacitor is electrically connected to a second node; and
a first terminal of the second transistor is electrically connected to the second node, a second terminal of the second transistor is electrically connected to the second terminal of the driving transistor, and a control terminal of the second transistor is configured to receive a compensating control signal.

5. The photosensitive circuit according to claim 4, further comprising a reset circuit, wherein the reset circuit is configured to reset the signal acquisition circuit and the photosensitive element.

6. The photosensitive circuit according to claim 5, wherein the reset circuit comprises a fourth transistor and a fifth transistor;
a first terminal of the fourth transistor is configured to receive a third supply voltage, and a second terminal of the fourth transistor is electrically connected to the second node; and
a first terminal of the fifth transistor is configured to receive a fourth supply voltage, and a second terminal of the fifth transistor is electrically connected to the first node.

7. The photosensitive circuit according to claim 6, wherein a control terminal of the fourth transistor and a control terminal of the fifth transistor are electrically connected to same one signal line.

8. The photosensitive circuit according to claim 6, wherein the second supply voltage and the fourth supply voltage are configured to be same one voltage electrical signal.

9. The photosensitive circuit according to claim 1, further comprising a switching circuit, wherein the switching circuit is configured to control whether to output the photosensitive current signal outputted by the signal acquisition circuit.

10. The photosensitive circuit according to claim 9, wherein the switching circuit comprises a third transistor;
- a first terminal of the third transistor is electrically connected to the second terminal of the driving transistor; and
- a second terminal of the third transistor is configured to be an output terminal of the photosensitive circuit.

11. An electronic device, comprising the photosensitive circuit according to claim 1.

12. A driving method for the photosensitive circuit according to claim 1, comprising:
- changing the threshold characteristic of the photosensitive element according to the intensity of light incident into the photosensitive element so as to produce the photosensitive voltage signal, and converting the photosensitive voltage signal into the photosensitive current signal, in a photosensitive stage.

13. The driving method according to claim 12, further comprising: resetting the signal acquisition circuit and the photosensitive circuit before the photosensitive stage.

14. The driving method according to claim 12, further comprising: compensating the signal acquisition circuit before the photosensitive stage and after resetting is performed, so that the signal acquisition circuit is able to output a photosensitive current signal corresponding to threshold voltage variation of the photosensitive element.

15. The photosensitive circuit according to claim 3, wherein the signal acquisition circuit comprises a driving transistor;
- a control terminal of the driving transistor is configured to receive the photosensitive voltage signal of the photosensitive element;
- a first terminal of the driving transistor is configured to receive a second supply voltage; and
- a second terminal of the driving transistor is configured to output the photosensitive current signal.

16. The photosensitive circuit according to claim 15, wherein the signal acquisition circuit further comprises a compensating circuit; and
- the compensating circuit is configured to compensate the driving transistor, so that the signal acquisition circuit is able to output a photosensitive current signal corresponding to threshold voltage variation of the photosensitive element.

17. The photosensitive circuit according to claim 16, wherein the photosensitive current signal, which is outputted by the signal acquisition circuit and corresponding to the threshold voltage variation of the photosensitive element, is relevant to the threshold voltage variation of the photosensitive element and is irrelevant to a threshold of the driving transistor and an initial threshold of the photosensitive element.

18. The photosensitive circuit according to claim 7, wherein the second supply voltage and the fourth supply voltage are configured to be same one voltage electrical signal.

* * * * *